United States Patent
Kishida

(10) Patent No.: US 7,301,491 B2
(45) Date of Patent: Nov. 27, 2007

(54) SWITCHING AMPLIFIER

(75) Inventor: Masahiro Kishida, Yaita (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/402,803

(22) Filed: Apr. 13, 2006

(65) Prior Publication Data

US 2006/0232457 A1    Oct. 19, 2006

(30) Foreign Application Priority Data

Apr. 14, 2005    (JP) ............................ 2005-116730

(51) Int. Cl.
*H03M 3/00* (2006.01)

(52) U.S. Cl. ...................... 341/143; 341/144

(58) Field of Classification Search ................ 341/143, 341/144

See application file for complete search history.

(56) References Cited

U.S. PATENT DOCUMENTS

| | | |
|---|---|---|
| 6,429,737 B1 | 8/2002 | O'Brien |
| 6,504,427 B2 | 1/2003 | Midya et al. |
| 6,518,849 B1 | 2/2003 | Delano |
| 6,856,194 B2 | 2/2005 | Nilsson et al. |
| 2004/0239542 A1 | 12/2004 | Olson et al. |
| 2006/0187099 A1* | 8/2006 | Fujimoto .................... 341/143 |

FOREIGN PATENT DOCUMENTS

JP    2000-295049    10/2000

OTHER PUBLICATIONS

Logan et al., "Linearization of class d output stages for high-performance audio power amplifier" International Conference on Advanced A-D and D-A Conversion Techniques and thier Applications, Conference Publication No. 393, © IEE, pp. 136-141 (1994), month unknown.

Magrath et al., "Design and implemantation of a FPGA sigma-delta power DAC" Signal Processing Systems, IEEE, pp. 511-521 (1997), month unknown.

* cited by examiner

*Primary Examiner*—Rexford Barnie
*Assistant Examiner*—Joseph Lauture
(74) *Attorney, Agent, or Firm*—Birch, Stewart, Kolasch & Birch, LLP

(57) ABSTRACT

A switching amplifier of the present invention includes a delta-sigma modulation circuit for processing an input signal by delta-sigma modulation to output a one-bit signal, a delay circuit for delaying the one-bit signal, and a pulse amplifier having a switching device that switches the switching device according to the signal outputted from the delay circuit to perform pulse amplification of the signal outputted from the delay section. The delay time of the delay circuit is variable. With this configuration, enhanced performance is obtained without changing the sampling frequency of the delta-sigma modulation circuit.

8 Claims, 5 Drawing Sheets

SWITCHING AMPLIFIER

This nonprovisional application claims priority under 35 U.S.C. § 119(a) on Patent Application No. 2005-116730 filed in Japan on Apr. 14, 2005, the entire contents of which are hereby incorporated by reference.

BACKGROUND OF THE INVENTION

1. Field of the Invention

The present invention relates to a switching amplifier that performs pulse amplification by using, as a switching control signal, a quantized signal obtained by processing an analog signal or a one-bit signal by delta-sigma modulation.

2. Description of Related Art

A one-bit signal obtained by processing an analog signal or a one-bit signal by delta-sigma modulation is advantageous in that it allows a frequency response to suit an audio source or the like, for example, by widening the effective frequency range or the dynamic range simply through appropriate selection of the constants of an integrator and an adder provided in the delta-sigma modulation circuit that performs the delta-signal modulation. For this reason, new standards for CDs (compact discs) and SACDs (super audio compact discs) adopt a one-bit signal for the recording of an audio signal, and such CDs and SACDs are commercialized. A one-bit signal is used not only for the recording of an audio signal as just mentioned, but also for power amplification and for signal transfer between devices.

A switching amplifier that performs power amplification by using a one-bit signal obtained by delta-sigma modulation obtains a high-voltage switching pulse based on the output of the semiconductor power amplifying device by feeding the one-bit signal obtained by delta-sigma modulation as it is to the control terminal of the semiconductor power amplifying device. Furthermore, it is possible to obtain a power-amplified demodulated analog signal simply by passing this switching pulse through a low-pass filter.

Moreover, since the semiconductor power amplifying device is controlled by the one-bit signal obtained by delta-sigma modulation, it is used in a non-linear region (saturated region) unlike an analog amplifier, which is used in a linear region (unsaturated region). Accordingly, a switching amplifier that performs power amplification by using a one-bit signal obtained by the delta-sigma modulation is advantageously capable of performing power amplification with extremely high efficiency, and such switching amplifiers have been commercialized.

FIG. 7 shows an example of the electrical configuration of a conventional switching amplifier that performs power amplification by using a one-bit signal obtained by delta-sigma modulation (see FIG. 7 of J-P-A-2000-295049).

The switching amplifier shown in FIG. 7 is composed of the following: an input terminal 1; an adder 2; a delta-sigma modulation circuit 3; a pulse amplifier 6 to which a constant voltage is applied from a constant voltage source 7; a low-pass filter 8; an output terminal 9; and an attenuator 10. The delta-sigma modulation circuit 3 is composed of the following: an integrator/adder group 4 provided with a plurality of cascade-connected integrators that integrate one input signal after another and an adder that adds up the outputs of the individual integrators; and a quantizer 5 that quantizes the signal outputted from the adder of the integrator/adder group 4 to convert it into a one-bit signal.

An input signal $S_{IN}$ (an analog signal or a one-bit signal) inputted from an input signal source (not shown) to the input terminal 1 is fed to the adder 2. A feedback signal $S_{FB}$ outputted from the attenuator 10 is also fed to the adder 2. The adder 2 subtracts the feedback signal $S_{FB}$ from the input signal $S_{IN}$, and feeds the resulting signal to the delta-sigma modulation circuit 3.

The delta-sigma modulation circuit 3 converts the signal fed from the adder 2 into a one-bit signal $S_Q$, and feeds the one-bit signal $S_Q$ to the pulse amplifier 6. The pulse amplifier 6 has a switching device (not shown) such as an FET, power-amplifies the one-bit signal $S_Q$ by switching the switching device according to the one-bit signal $S_Q$, and feeds the power-amplified one-bit signal to the low-pass filter 8 and to the attenuator 10. The output signal of the pulse amplifier 6 has its high frequency component eliminated by the low-pass filter 8, and is thereby formed into an output signal $S_{OUT}$ that is an analog signal. This output signal $S_{OUT}$ is outputted via the output terminal 9. The output signal of the pulse amplifier 6 is also attenuated by the attenuator 10, and is thereby formed into the feedback signal $S_{FB}$.

The pulse amplifier 6, which power-amplifies the one-bit signal $S_Q$, produces switching loss attributable to the capacitive and resistive components of the switching device it includes. This switching loss lowers the power efficiency of the switching amplifier shown in FIG. 7.

Hence, from the viewpoint of energy saving, measures are sometimes taken to reduce the number of times that the switching device switches in the pulse amplifier 6 with a view to reducing the switching loss. In the switching amplifier shown in FIG. 7, so as to reduce the switching loss, the number of times that the switching device switches in the pulse amplifier 6 is reduced by lowering the sampling frequency of the delta-sigma modulation circuit 3.

However, a low sampling frequency of the delta-sigma modulation circuit 3 disadvantageously narrows the noise shaping frequency range or when the input signal $S_{IN}$ is an analog audio signal, disadvantageously reduces the SN ratio (signal-to-noise ratio) of the audio frequency range with respect to which the analog audio signal is processed.

On the other hand, from the viewpoint of a wider dynamic range and low residual noise, measures are sometimes taken to raise the sampling frequency of the delta-sigma modulation circuit 3 in the switching amplifier shown in FIG. 7 with a view to increasing the amount of information per unit time.

So as to raise the sampling frequency of the delta-sigma modulation circuit 3, however, the master clock frequency needs to be raised, and this increases radiated noise. Hence, extra cost for measures against EMI (electromagnetic interference) is required, which is disadvantageous.

SUMMARY OF THE INVENTION

An object of the present invention is to provide a switching amplifier that offers enhanced performance without a change in the sampling frequency of a delta-sigma modulation circuit.

To achieve the above object, according to the present invention, a switching amplifier includes: a delta-sigma modulation circuit that processes an input signal by delta-sigma modulation to output a quantized signal; a delay section that delays the quantized signal; and a pulse amplifier having a switching device that switches the switching device according to the signal outputted from the delay section so as to perform pulse amplification of the signal outputted from the delay section. The delay time of the delay section is variable.

With this configuration, by varying the delay time of the delay section, the minimum pulse width of the pulse signal outputted from the pulse amplifier can be varied without changing the sampling frequency of the delta-sigma modulation circuit. Thus, without changing the sampling frequency of the delta-sigma modulation circuit, it is possible to obtain enhanced performance. The delay section may be designed to be able to set the delay time at zero. The delay section and the pulse amplifier need not be provided separately; that is, the delay section may be incorporated in the pulse amplifier.

The above switching amplifier may be so configured that the delay section includes an input terminal, a plurality of delay elements, and an output terminal, that the plurality of delay elements produce fixed delay times respectively, that the plurality of delay elements are cascade-connected, and that the delay time of the delay section is varied by varying interconnection among the input terminal, the plurality of delay elements, and the output terminal. With this configuration, the delay section for varying the delay time can be realized with a simple circuit design.

The switching amplifier of any of the configurations described above may be further provided with a delay time controller for controlling the delay time of the delay section, so that, as a result of the delay time controller controlling the delay time of the delay section, the minimum pulse width of the pulse signal outputted from the pulse amplifier is controlled, and thereby the number of times that the pulse amplifier switches per unit time is controlled. Alternatively, the switching amplifier may be further provided with a delay time controller for controlling a delay time of the delay section, so that, as a result of the delay time controller controlling the delay time of the delay section, the minimum pulse width of the pulse signal outputted from the pulse amplifier is controlled, and thereby the amount of information that the switching amplifier outputs per unit time is controlled.

With the former control, the delay time controller can control the delay section to increase the delay time it produces. This makes it possible, without changing the sampling frequency of the delta-sigma modulation circuit, to increase the minimum pulse width of the pulse signal outputted from the pulse amplifier, and thereby to reduce the number of times that the pulse amplifier switches per unit time. Thus, it is possible, without changing the sampling frequency of the delta-sigma modulation circuit, to achieve enhanced power efficiency. Since the number of times that the pulse amplifier switches per unit time is reduced without lowering the sampling frequency of the delta-sigma modulation circuit, no such problems occur as a narrowing of the noise shaping frequency range and, in a case where the input signal is an analog audio signal, a reduction in the SN (signal-to-noise) ratio in the audible range in which the analog audio signal is processed.

With the latter control, the delay time controller can control the delay section to decrease the delay time it produces. This makes it possible, without changing the sampling frequency of the delta-sigma modulation circuit, to decrease the minimum pulse width of the pulse signal outputted from the pulse amplifier, and thereby to increase the amount of information that the switching amplifier outputs per unit time. Thus, it is possible, without changing the sampling frequency of the delta-sigma modulation circuit, to achieve a wide dynamic range and low residual noise. Since the amount of information that the switching amplifier outputs per unit time is increased without raising the sampling frequency of the delta-sigma modulation circuit, no such problems occur as an increase in radiated noise, as a result of raising the master clock frequency with a view to raising the sampling frequency of the delta-sigma modulation circuit, and the resulting increase in cost for measures against EMI (electromagnetic interference). Furthermore, in a case where the input signal is an analog audio signal, by increasing the amount of information that the switching amplifier outputs per unit time, it is possible to enhance the resolution and naturalness of sound.

The switching amplifier of any of the configurations described above may be further provided with a converter for converting an output signal of the pulse amplifier into an analog signal. With this configuration, it is possible to yield an analog output.

The switching amplifier of any of the configurations described above may be further provided with a feedback section for feeding a signal based on the output signal of the pulse amplifier back to the delta-sigma modulation circuit. With this configuration, it is possible to improve the distortion factor and the SN ratio of the pulse amplifier itself.

DETAILED DESCRIPTION OF PREFERRED EMBODIMENTS

Figure 1:
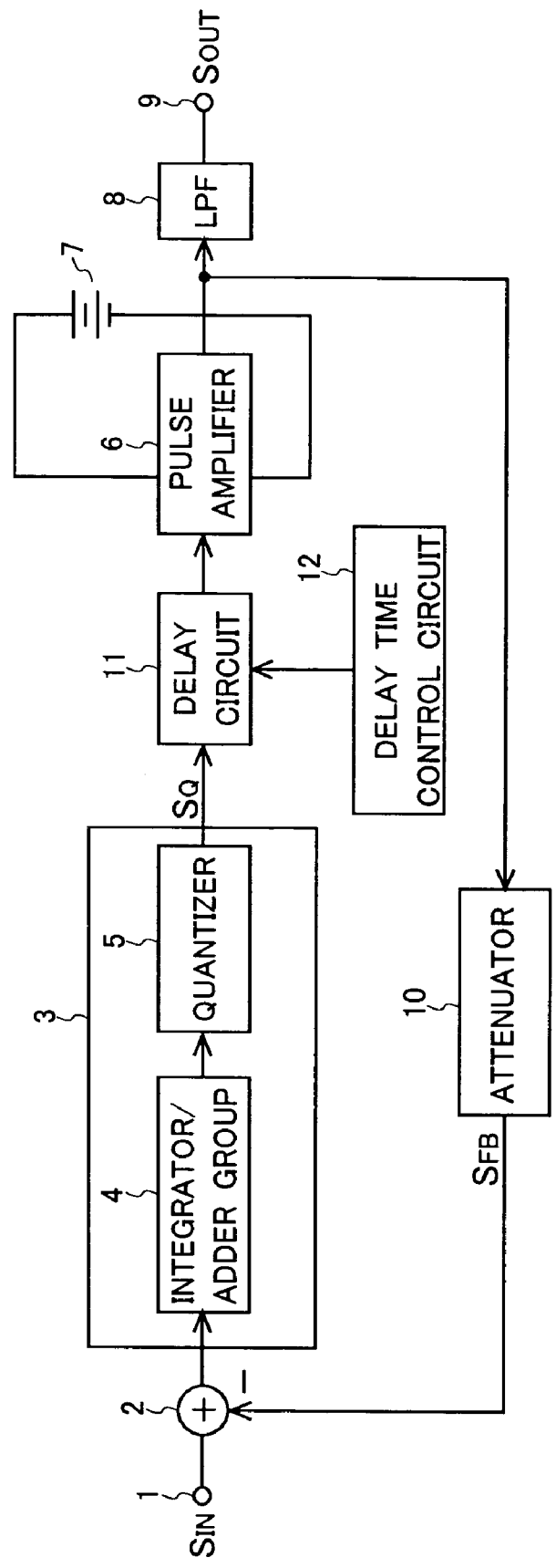
FIG. 1 is a diagram showing an example of the electrical configuration of a switching amplifier according to the present invention.
Figure 7:
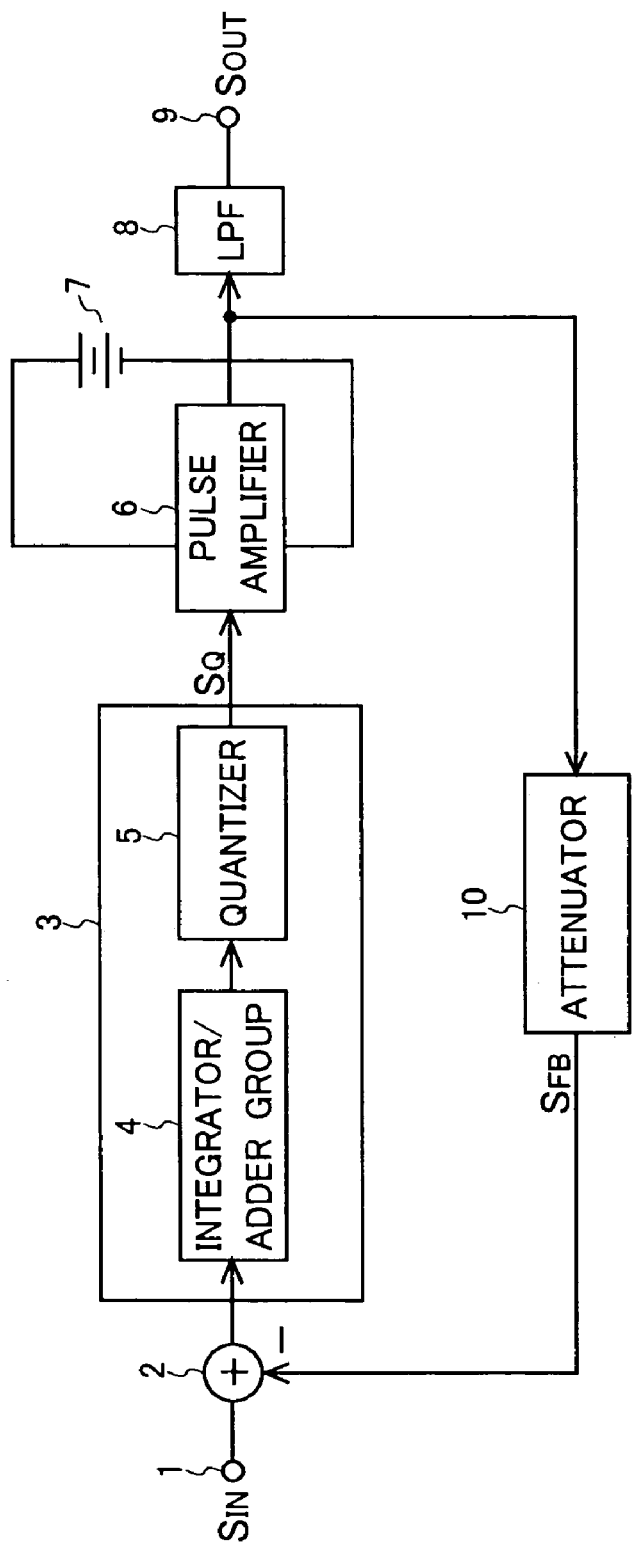
FIG. 7 is a diagram showing an example of the electrical configuration of a conventional switching amplifier.

Hereinafter, embodiments of the present invention will be described with reference to the accompanying drawings. An example of the electrical configuration of a switching amplifier according to the present invention is shown in FIG. 1. In FIG. 1, such parts as are found also in FIG. 7 are identified with common reference numerals and symbols.

The switching amplifier shown in FIG. 1 is a switching amplifier that performs power amplification by using a one-bit signal obtained by delta-sigma modulation, and includes: an input terminal 1; an adder 2; a delta-sigma modulation circuit 3; a pulse amplifier 6 to which a constant voltage is applied from a constant voltage source 7; a low-pass filter 8; an output terminal 9; an attenuator 10; a delay circuit 11; and a delay time control circuit 12. The delta-sigma modulation circuit 3 includes: an integrator/adder group 4 including a plurality of cascade-connected integrators that integrate one input signal after another and an adder that adds up the outputs of the individual integrators; and a quantizer 5 that quantizes the signal outputted from the adder included in the integrator/adder group 4 to convert it into a one-bit signal.

An input signal $S_{IN}$ (an analog signal or a one-bit signal) inputted from an input signal source (not shown) to the input terminal 1 is fed to the adder 2. A feedback signal $S_{FB}$ outputted from the attenuator 10 is also fed to the adder 2.

The adder 2 subtracts the feedback signal $S_{FB}$ from the input signal $S_{IN}$, and feeds the resulting signal to the delta-sigma modulation circuit 3.

The delta-sigma modulation circuit 3 converts the signal fed from the adder 2 into a one-bit signal $S_Q$, and feeds the one-bit signal $S_Q$ to the delay circuit 11. The delay circuit 11 delays the one-bit signal $S_Q$ outputted from the delta-sigma modulation circuit 3 by a delay time according to the control of the delay time control circuit 12, and then feeds it to the pulse amplifier 6. The pulse amplifier 6 includes a switching device (not shown) such as an FET. According to the one-bit signal outputted from the delay circuit 11, the pulse amplifier 6 switches the switching device and thereby power-amplifies the one-bit signal outputted from the delay circuit 11. The pulse amplifier 6 then feeds the power-amplified one-bit signal to the low-pass filter 8 and to the attenuator 10. The output signal of the pulse amplifier 6 has its high-frequency component eliminated by the low-pass filter 8, and is thereby formed into an output signal $S_{OUT}$ that is an analog signal. This output signal $S_{OUT}$ is outputted via the output terminal 9. The output signal of the pulse amplifier 6 is also attenuated by the attenuator 10, and is thereby formed into the feedback signal $S_{FB}$.

Figure 2:
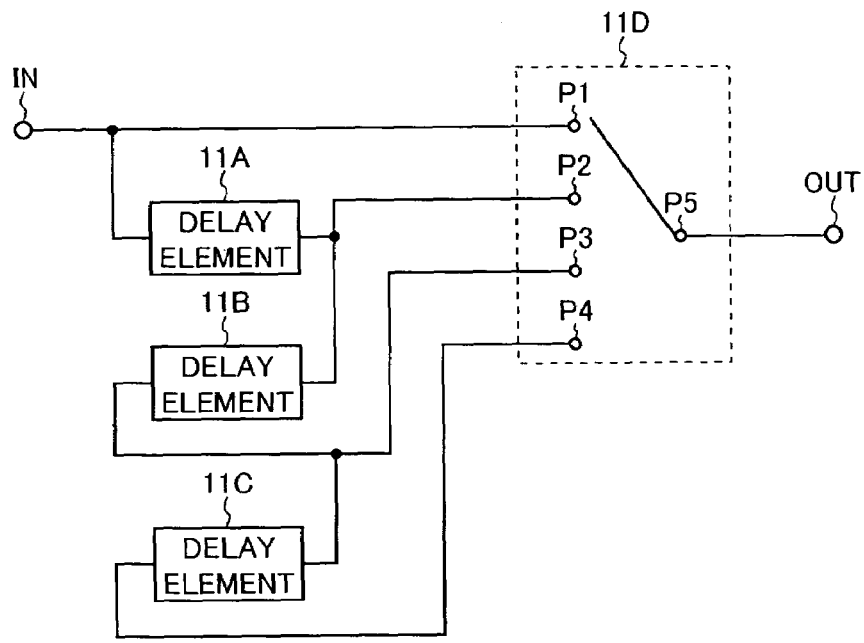
FIG. 2 is a diagram showing an example of the configuration of the delay element.

An example of the configuration of the delay circuit 11 is shown in FIG. 2. The delay circuit shown in FIG. 2 includes an input terminal IN, delay elements 11A to 11C, a switch 11D controlled by the delay time control circuit 12, and an output terminal OUT. The input terminal IN is connected to the input end of the delay element 11A and to the contact P1 of the switch 11D. The output end of the delay element 11A is connected to the input end of the delay element 11B and to the contact P2 of the switch 11D. The output end of the delay element 11B is connected to the input end of the delay element 11C and to the contact P3 of the switch 11D. The output end of the delay element 11C is connected to the contact P4 of the switch 11D. The contact P5 of the switch 11D is connected to the output terminal OUT. The delay time of each of the delay elements 11A to 11C is fixed at a predetermined value within the range from $50 \times 10^{-9}$ to $100 \times 10^{-9}$ seconds.

When the contacts P1 and P5 of the switch 11D are electrically connected together under the control of the delay time control circuit 12, the delay time of the delay circuit shown in FIG. 2 equals zero. When the contacts P2 and P5 of the switch 11D are electrically connected together under the control of the delay time control circuit 12, the delay time of the delay circuit shown in FIG. 2 equals the delay time of the delay element 11A. When the contacts P3 and P5 of the switch 11D are electrically connected together under the control of the delay time control circuit 12, the delay time of the delay circuit shown in FIG. 2 equals the sum of the delay times of the delay elements 11A and 11B. When the contacts P4 and P5 of the switch 11D are electrically connected together under the control of the delay time control circuit 12, the delay time of the delay circuit shown in FIG. 2 equals the sum of the delay times of the delay elements 11A, 11B, and 11C.

Figure 3:
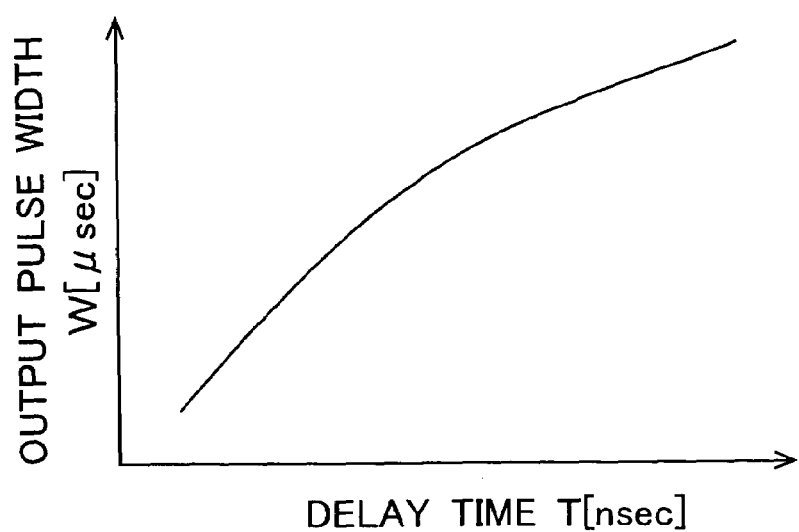
FIG. 3 is a diagram showing the relationship between the delay time and the output pulse width.

The relationship between the delay time T of the delay circuit 11 and the minimum pulse width (hereinafter referred to as output pulse width) W of the pulse signal outputted from the pulse amplifier 6 is shown in FIG. 3. As will be clear from FIG. 3, the delay time T of the delay circuit 11 and the output pulse width W have a positive correlation. Incidentally, the relationship between the delay time T of the delay circuit 11 and the output pulse width W varies according to the following: the circuit configuration of the delta-sigma modulation circuit 3 (whose circuit configuration varies according to the order of the delta-sigma modulation it performs, whether or not it is of a continuous-time or discrete-time type, and other factors); the sampling frequency of the delta-sigma modulation circuit 3; the time constant of the switching device which is determined by the capacitive and resistive components thereof, the switching device being incorporated in the pulse amplifier 6; and other factors. Irrespective of any of these factors, the delay time T of the delay circuit 11 and the output pulse width W have a positive correlation.

The switching amplifier shown in FIG. 1 can, under the control of the delay time control circuit 12, vary the delay time T of the delay circuit 11, and can thus vary the output pulse width W without changing the sampling frequency of the delta-sigma modulation circuit 3. Since the delay time T of the delay circuit 11 and the output pulse width W have a positive correlation as described above, the switching amplifier shown in FIG. 1 can, under the control of the delay time control circuit 12, increase the delay time T of the delay circuit 11 and thereby increase the output pulse width W without changing the sampling frequency of the delta-sigma modulation circuit 3, and also can, under the control of the delay time control circuit 12, decrease the delay time T of the delay circuit 11 and thereby decrease the output pulse width W without changing the sampling frequency of the delta-sigma modulation circuit 3.

Figure 4:
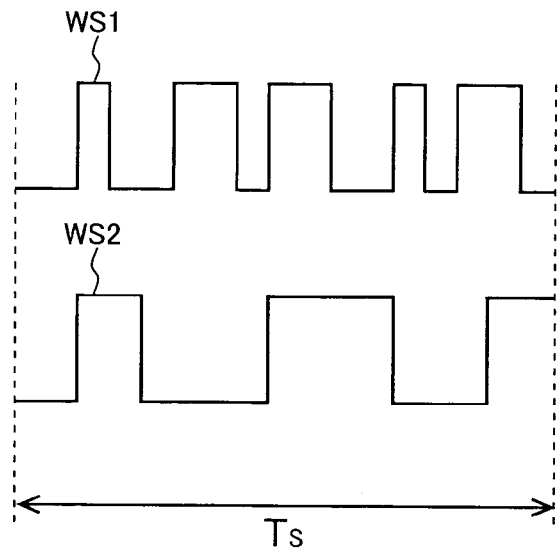
FIG. 4 is a diagram showing examples of the waveform of the one-bit signal fed from the delay circuit to the pulse amplifier.

Examples of the waveform of the one-bit signal fed from the delay circuit 11 to the pulse amplifier 6 is shown in FIG. 4. Every time the one-bit signal fed from the delay circuit 11 to the pulse amplifier 6 changes levels, the switching device included in the pulse amplifier 6 switches.

If the one-bit signal fed from the delay circuit 11 the pulse amplifier 6 has the waveform WS1 shown in FIG. 4, the switching device included in the pulse amplifier 6 switches ten times in a predetermined time Ts. If the one-bit signal fed from the delay circuit 11 to the pulse amplifier 6 has the waveform WS2 shown in FIG. 4, the switching device included in the pulse amplifier 6 switches five times in a predetermined time Ts. That is, the pulse width of the one-bit signal fed from the delay circuit 11 to the pulse amplifier 6 and the number of times that the pulse amplifier 6 switches in a predetermined time have a negative correlation. Moreover, the timing with which the one-bit signal fed from the delay circuit 11 to the pulse amplifier 6 changes levels is approximately identical with the timing with which the pulse signal outputted from the pulse amplifier 6 changes levels.

Figure 5:
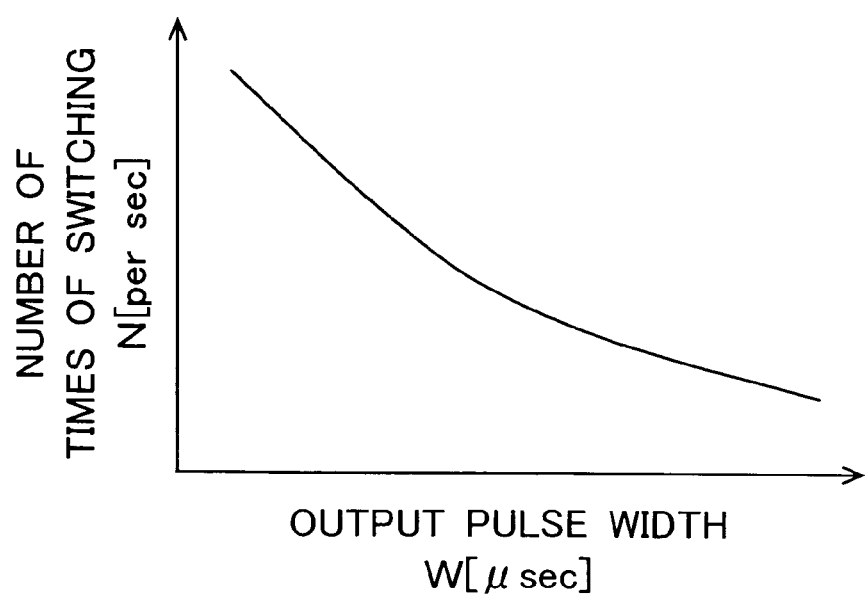
FIG. 5 is a diagram showing the relationship between the output pulse width and the number of times of switching.

That is, the output pulse width W and the number N of times that the pulse amplifier 6 switches per unit time have a negative correlation as shown in FIG. 5. Incidentally, the relationship between the output pulse width W and the number N of times that the pulse amplifier 6 switches per unit time varies according to the following: the circuit configuration of the delta-sigma modulation circuit 3 (whose circuit configuration varies according to the order of the delta-sigma modulation it performs, whether it is of a continuous-time or discrete-time type, and other factors); the sampling frequency of the delta-sigma modulation circuit 3; the time constant of the switching device which is determined by the capacitive and resistive components thereof, the switching device being incorporated in the pulse amplifier 6; and other factors. Irrespective of any of these factors, the output pulse width W and the number N of times that the pulse amplifier 6 switches per unit time have a negative correlation.

Figure 6:
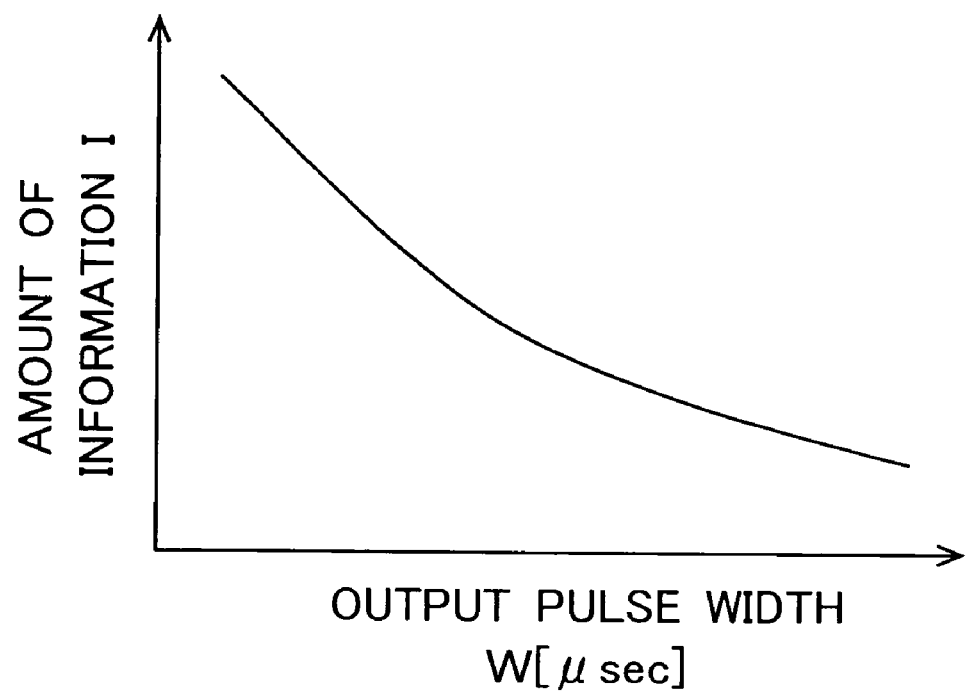
FIG. 6 is a diagram showing the relationship between the output pulse width and the amount of information.

Moreover, the output pulse width W and the amount (hereinafter referred to as information amount) I of information that the switching amplifier shown in FIG. 1 outputs per unit time have a negative correlation as shown in FIG. 6. Incidentally, the relationship between the output pulse width W and the information amount I varies according to the following: the circuit configuration of the delta-sigma modulation circuit 3 (whose circuit configuration varies according to the order of the delta-sigma modulation it performs, whether it is of a continuous-time or discrete-time type, and other factors); the sampling frequency of the delta-sigma modulation circuit 3; the time constant of the switching device which is determined by the capacitive and resistive components thereof, the switching device being incorporated in the pulse amplifier 6; and other factors. Irrespective of any of these factors, the output pulse width W and the information amount I have a negative correlation.

In the switching amplifier shown in FIG. 1, under the control of the delay time control circuit 12, the delay time T of the delay circuit 11 can be increased. This makes it possible, without changing the sampling frequency of the delta-sigma modulation circuit 3, to increase the output pulse width W and thereby reduce the number N of times that the pulse amplifier 6 switches (see FIGS. 3 and 5). Thus, it is possible, without changing the sampling frequency of the delta-sigma modulation circuit 3, to achieve enhanced power efficiency. Since the number N of times that the pulse amplifier 6 switches per unit time is reduced without lowering the sampling frequency of the delta-sigma modulation circuit 3, no such problems occur as a narrowing of the noise shaping frequency range and, in a case where the input signal SN is an analog audio signal, a reduction in the SN (signal-to-noise) ratio in the audible range in which the analog audio signal is processed.

Moreover, in the switching amplifier shown in FIG. 1, under the control of the delay time control circuit 12, the delay time T of the delay circuit 11 can be decreased. This makes it possible, without changing the sampling frequency of the delta-sigma modulation circuit 3, to decrease the output pulse width W and thereby increase the information amount I (see FIGS. 3 and 6). Thus, it is possible, without changing the sampling frequency of the delta-sigma modulation circuit 3, to achieve a wide dynamic range and low residual noise. Since the information amount I is increased without raising the sampling frequency of the delta-sigma modulation circuit 3, no such problems occur as an increase in radiated noise, as a result of raising the master clock frequency with a view to raising the sampling frequency of the delta-sigma modulation circuit 3, and the resulting increase in cost for measures against EMI (electromagnetic interference). Furthermore, in a case where the input signal $S_{IN}$ is an analog audio signal, by increasing the amount of information I, it is possible to enhance the resolution and naturalness of sound.

An example of the delay time control circuit 12 is a circuit that is provided with a detecting section for detecting the SN ratio of the pulse signal outputted from the pulse amplifier 6 and that controls the delay circuit 11 in such a way as to reduce the delay time T of the delay circuit 11 when the SN ratio of the pulse signal outputted from the pulse amplifier 6 is low. Another example of the delay time control circuit 12 is a circuit that controls the delay circuit 11 in such a way as to vary the delay time T of the delay circuit 11 according to signals from an input section such as operation keys.

In the embodiment described above, the delay time of each of the delay elements 11A to 11C is fixed at a predetermined value within the range from $50 \times 10^{-9}$ to $100 \times 10^{-9}$ seconds. This, however, is not meant to limit the delay times of the delay elements 11A to 11C within the range from $50 \times 10^{-9}$ to $100 \times 10^{-9}$ seconds; that is, the delay time of the delay circuit 11 may be set within any other range that is permitted by the delta-sigma modulation circuit actually used (that is, in which the delta-sigma modulation circuit actually used can operate). In the embodiment described above, the delay circuit 11 has three delay elements. This, however, is not meant to limit the number of the delay element incorporated in the delay circuit 11 to three. Although the switching amplifier shown in FIG. 1 is provided with the attenuator 10, in a case where the output voltage of the constant voltage source 7 is low and the crest voltage of the pulse signal outputted from the pulse amplifier 6 is low, the attenuator 10 may not be provided. Although, in the switching amplifier shown in FIG. 1, the delay circuit 11 delays the one-bit signal $S_Q$, the pulse amplifier 6 may include, instead of the delay circuit 11, a delay element that delays the one-bit signal $S_Q$.

What is claimed is:

1. A switching amplifier comprising:
   a delta-sigma modulation circuit for processing an input signal by delta-sigma modulation to output a quantized signal;
   a delay section for delaying the quantized signal;
   a pulse amplifier that includes a switching device and that, according to a signal outputted from the delay section, switches the switching device to perform pulse amplification of the signal outputted from the delay section, wherein a delay time of the delay section is variable; and
   a delay time controller for controlling the delay time of the delay section, wherein, as a result of the delay time controller controlling the delay time of the delay section, a minimum pulse width of a pulse signal outputted from the pulse amplifier is controlled, and thereby a number of times that the pulse amplifier switches per unit time is controlled.

2. The switching amplifier of claim 1, wherein
   the delay section comprises an input terminal, a plurality of delay elements, and an output terminal,
   the plurality of delay elements produce fixed delay times respectively, the plurality of delay elements are cascade-connected, and
   the delay time of the delay section is varied by varying interconnection among the input terminal, the plurality of delay elements, and the output terminal.

3. The switching amplifier of claim 1, further comprising a converter for converting an output signal of the pulse amplifier into an analog signal.

4. The switching amplifier of claim 1, further comprising a feedback section for feeding a signal based on an output signal of the pulse amplifier back to the delta-sigma modulation circuit.

5. A switching amplifier, comprising:
   a delta-sigma modulation circuit for processing an input signal by delta-sigma modulation to output a quantized signal;
   a delay section for delaying the quantized signal;
   a pulse amplifier that includes a switching device and that, according to a signal outputted from the delay section, switches the switching device to perform pulse amplification of the signal outputted from the delay section, wherein a delay time of the delay section is variable; and
   a delay time controller for controlling the delay time of the delay section, wherein, as a result of the delay time controller controlling the delay time of the delay section, a minimum pulse width of a pulse signal outputted from the pulse amplifier is controlled, and thereby an amount of information that the switching amplifier outputs per unit time is controlled.

6. The switching amplifier of claim 5, wherein the delay section comprises an input terminal, a plurality of delay elements, and an output terminal, the plurality of delay elements produce fixed delay times respectively, the plurality of delay elements are cascade-connected, and the delay time of the delay section is varied by varying interconnection among the input terminal, the plurality of delay elements, and the output terminal.

7. The switching amplifier of claim 5, further comprising a converter for converting an output signal of the pulse amplifier into an analog signal.

8. The switching amplifier of claim 5, further comprising a feedback section for feeding a signal based on an output signal of the pulse amplifier back to the delta-sigma modulation circuit.

* * * * *